(12) United States Patent
Shuto et al.

(10) Patent No.: US 9,601,198 B2
(45) Date of Patent: Mar. 21, 2017

(54) MEMORY CIRCUIT PROVIDED WITH BISTABLE CIRCUIT AND NON-VOLATILE ELEMENT

(71) Applicant: Japan Science and Technology Agency, Saitama (JP)

(72) Inventors: Yusuke Shuto, Kanagawa (JP); Shuichiro Yamamoto, Kanagawa (JP); Satoshi Sugahara, Kanagawa (JP)

(73) Assignee: JAPAN SCIENCE AND TECHNOLOGY AGENCY, Saitama (JP)

( * ) Notice: Subject to any disclaimer, the term of this patent is extended or adjusted under 35 U.S.C. 154(b) by 0 days.

(21) Appl. No.: 14/543,487

(22) Filed: Nov. 17, 2014

(65) Prior Publication Data
US 2015/0070974 A1    Mar. 12, 2015

Related U.S. Application Data

(63) Continuation of application No. PCT/JP2013/054052, filed on Feb. 19, 2013.

(30) Foreign Application Priority Data

May 18, 2012   (JP) ................................. 2012-114989

(51) Int. Cl.
   *G11C 14/00*   (2006.01)
(52) U.S. Cl.
   CPC ................. *G11C 14/0081* (2013.01)
(58) Field of Classification Search
   USPC ........................................................ 365/148
   See application file for complete search history.

(56) References Cited

U.S. PATENT DOCUMENTS

| 5,969,995 A | 10/1999 | Morishima |
|---|---|---|
| 6,198,683 B1 | 3/2001 | Ishii et al. |

(Continued)

FOREIGN PATENT DOCUMENTS

| JP | H11-219589 A | 8/1999 |
|---|---|---|
| JP | 2010-232959 A | 10/2010 |

(Continued)

OTHER PUBLICATIONS

Yusuke Shuto et al., "Evaluation and Control of Break-Even Time of Nonvolatile Static Random Access Memory Based on Spin-Transistor Architecture with Spin-Transfer-Torque Magnetic Tunnel Junctions," Japanese Journal of Applied Physics 51 (2012), Mar. 30, 2012, pp. 040212-1-040212-3 (3 pages), The Japan Society of Applied Physics, Japan.

(Continued)

*Primary Examiner* — Hoai V Ho
*Assistant Examiner* — Minh Dinh
(74) *Attorney, Agent, or Firm* — Michael Best & Friedrich LLP

(57) ABSTRACT

A memory circuit includes: a bistable circuit (30) that stores data; nonvolatile elements (MTJ1, MTJ2) that store data written in the bistable circuit in a nonvolatile manner, and restore data stored in a nonvolatile manner into the bistable circuit; and a control unit that stores data written in the bistable circuit in a nonvolatile manner and cuts off a power supply to the bistable circuit when the period not to read data from or write data into the bistable circuit is longer than a predetermined time period, and does not store data written in the bistable circuit in a nonvolatile manner and makes the supply voltage for the bistable circuit lower than a voltage during the period to read data from or write data into the bistable circuit when the period not to read or write data is shorter than the predetermined time period.

15 Claims, 12 Drawing Sheets

(56) References Cited

U.S. PATENT DOCUMENTS

| | | | |
|---|---|---|---|
| 8,295,079 B2* | 10/2012 | Yamamoto | G11C 14/0081 365/145 |
| 2004/0052106 A1 | 3/2004 | Ohtani | |
| 2004/0257113 A1 | 12/2004 | Toyoda et al. | |
| 2008/0080231 A1 | 4/2008 | Abe et al. | |
| 2008/0225590 A1 | 9/2008 | Lamorey | |
| 2011/0216573 A1 | 9/2011 | Abe et al. | |
| 2011/0273925 A1 | 11/2011 | Yamamoto et al. | |
| 2012/0271984 A1* | 10/2012 | Ohmaru | G11C 14/0054 711/103 |

FOREIGN PATENT DOCUMENTS

| | | |
|---|---|---|
| JP | 2011-187114 A | 9/2011 |
| WO | WO-2004/040582 A1 | 5/2004 |
| WO | WO-2009/028298 A1 | 3/2009 |

OTHER PUBLICATIONS

Masashi Takata et al., "Nonvolatile SRAM based on Phase Change," IEICE Technical Report ICD2006-10, Apr. 2006, pp. 49-54 (6 pages), The Institute of Electronics, Information and Communication Engineers, Japan.

International Search Report issued in Application No. PCT/JP2013/054052, mailed Apr. 16, 2013.

Office Action issued in Taiwan Patent Application No. 102117352, dated Apr. 20, 2015.

Office Action issued in Korean Application No. 10-2014-7032015, dated Feb. 1, 2016.

* cited by examiner

MEMORY CIRCUIT PROVIDED WITH BISTABLE CIRCUIT AND NON-VOLATILE ELEMENT

CROSS-REFERENCE TO RELATED APPLICATION

This application is a continuation application of International Patent Application No. PCT/JP2013/054052, filed on Feb. 19, 2013, which claims priority to Japanese Patent Application No. 2012-114989 filed on May 18, 2012, subject matter of these patent documents is incorporated by reference herein its entirety.

TECHNICAL FIELD

The present invention relates to memory circuit, and more particularly, to a memory circuit that provided with bistable circuit and nonvolatile element, for example.

BACKGROUND ART

In a known memory device, data written in a bistable circuit of a SRAM (Static Random Access Memory) is stored into a ferromagnetic tunnel junction element (MTJ) in a nonvolatile manner, to cut off the power supply to the bistable circuit. After that, when the bistable circuit is turned on, the data is restored into the bistable circuit from the MTJ (see Patent Document 1, for example). Power consumption can be reduced by using this memory device in a microprocessor, a system-on-chip, a microcontroller, an FPGA (Field Programmable Gate Array), a CMOS (Complementary Metal Oxide Semiconductor) logic, or the like.

PRIOR ART DOCUMENT

Patent Document

Patent Document 1: International Publication Pamphlet WO 2009/028298 A

SUMMARY OF THE INVENTION

Problem to be Solved by the Invention

In the memory circuit disclosed in Patent Document 1, data in a bistable circuit can be stored into an MTJ in a nonvolatile manner, and accordingly, the power supply to the bistable circuit can be cut off. As a result, standby power consumption can be dramatically reduced. While power is being supplied, however, power consumption is larger than that with a conventional SRAM.

The present invention has been made in view of the above problem, and aims to reduce power consumption.

Means for Solving the Problem

The present invention is a memory circuit that includes: a bistable circuit that writes data; a nonvolatile element that stores data written in the bistable circuit in a nonvolatile manner, and restores data stored in a nonvolatile manner into the bistable circuit; and a control unit that stores data written in the bistable circuit into the nonvolatile element in a nonvolatile manner and cuts off a power supply to the bistable circuit when a period not to read data from or write data into the bistable circuit is longer than a predetermined time period, and does not store data written in the bistable circuit into the nonvolatile element in a nonvolatile manner and makes a supply voltage for the bistable circuit lower than a voltage during a period to read data from or write data into the bistable circuit when the period not to read or write data is shorter than the predetermined time period. According to the present invention, power consumption can be reduced.

In the above structure, the control unit may determine whether the period not to read data from or write data into the bistable circuit is longer than the predetermined time period. When determining that the period not to read data from or write data into the bistable circuit is longer than the predetermined time period, the control unit stores data written in the bistable circuit into the nonvolatile element in a nonvolatile manner, and cuts off the power supply to the bistable circuit. When determining that the period not to read or write data is shorter than the predetermined time period, the control unit does not store data written in the bistable circuit into the nonvolatile element in a nonvolatile manner, and makes the supply voltage for the bistable circuit lower than the voltage during the period to read data from or write data into the bistable circuit.

In the above structure, the predetermined time period may be equal to or longer than a period during which the amount of power consumed when the supply voltage for the bistable circuit during the predetermined time period is lowered becomes equal to the amount of power consumed when data is stored and restored into the nonvolatile element.

In the above structure, the predetermined time period may be equal to or longer than $(E_{store}^{SC}+E_{restore}^{SC})/((I_{LS}^{NV}-I_L^{SD})\times V_{sleep})$, $E_{store}^{SC}$ representing an energy calculated by subtracting an energy in a case where the supply voltage for the bistable circuit is lowered during a period to store data into the volatile element, from an energy for storing data into the nonvolatile element, $E_{restore}^{SC}$ representing an energy calculated by subtracting an energy in a case where the supply voltage for the bistable circuit is lowered during a period to restore data from the nonvolatile element, from an energy for restoring data from the nonvolatile element, $I_{LS}^{NV}$ representing a current consumed in a case where the supply voltage for the bistable circuit is lowered, $I_L^{SD}$ representing a current consumed in a case where the power supply to the bistable circuit is cut off, $V_{sleep}$ representing a supply voltage in a case where the supply voltage for the bistable circuit is lowered.

In the above structure, the nonvolatile element may have one end connected to a node in the bistable circuit, and have the other end connected to a control line.

In the above structure, the nonvolatile element may store data written in the bistable circuit in a nonvolatile manner by using a current flowing between the one end and the other end.

In the above structure, the bistable circuit may include a first node and a second node, the first node and the second node being complementary to each other. The nonvolatile element may include a first nonvolatile element having one end connected to the first node and the other end connected to the control line, and a second nonvolatile element having one end connected to the second node and the other end connected to the control line.

The above structure may further include: a MOSFET having the source and the drain connected in series to the nonvolatile element between the node and the control line; and a control unit that makes a voltage of the control line during a period for the bistable circuit to write data higher than the lowest voltage to be applied to the control line during a period to store data written in the bistable circuit into the nonvolatile element in a nonvolatile manner.

In the above structure, the control unit may make the voltage of the control line during the period for the bistable circuit to store data higher than a voltage of the control line during a period to cut off the power supply to the bistable circuit.

In the above structure, the nonvolatile element may be a ferromagnetic tunnel junction element.

The present invention is a memory circuit that includes: a bistable circuit that writes stores data; a nonvolatile element that stores data written in the bistable circuit in a nonvolatile manner and restores data written in a nonvolatile manner into the bistable circuit by changing a resistance value with a current flowing between one end and the other end, the nonvolatile element having the one end connected to a node in the bistable circuit and the other end connected to a control line; an FET that has the source and the drain connected in series to the nonvolatile element between the node and the control line; and a control unit that makes a voltage to be applied to the gate of the FET during a period to restore data stored in the nonvolatile element in a nonvolatile manner into the bistable circuit lower than a supply voltage to be applied to the bistable circuit during a period to write data into and read data from the bistable circuit in a volatile manner. According to the present invention, power consumption can be reduced.

In the above structure, the control unit may make a voltage to be applied to the gate during a period to store data written in the bistable circuit into the nonvolatile element in a nonvolatile manner lower than the supply voltage.

In the above structure, the control unit may make the highest voltage to be applied to the control line during a period to store data written in the bistable circuit into the nonvolatile element in a nonvolatile manner lower than the supply voltage.

Effects of the Invention

According to the present invention, power consumption can be reduced.

MODES FOR CARRYING OUT THE EMBODIMENTS

Figure 1A:
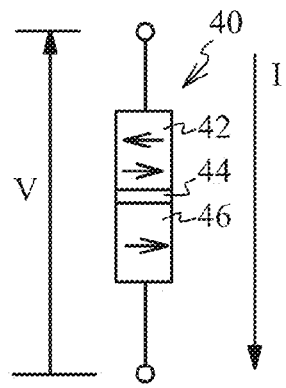
FIGS. 1A and 1C are diagrams showing an example of a ferromagnetic tunnel junction element.

First, a ferromagnetic tunnel junction element is described as a nonvolatile element. FIG. 1A is a diagram showing an example of a ferromagnetic tunnel junction element. The ferromagnetic tunnel junction element 40 includes a ferromagnetic electrode free layer 42, a ferromagnetic electrode pinned layer 46, and a tunnel insulator 44 interposed between the ferromagnetic electrode free layer 42 and the ferromagnetic electrode pinned layer 46. The ferromagnetic electrode free layer 42 and the ferromagnetic electrode pinned layer 46 are made of a ferromagnetic metal, a half-metallic ferromagnet, or a ferromagnetic semiconductor. The ferromagnetic electrode free layer 42 has a variable magnetization direction. On the other hand, the ferromagnetic electrode pinned layer 46 has a pinned magnetization direction. A state where the magnetization directions of the ferromagnetic electrode free layer 42 and the ferromagnetic electrode pinned layer 46 are parallel to each other is referred to as a parallel magnetization, and a state where the magnetization directions are antiparallel to each other is referred to as an antiparallel magnetization.

Figure 1B:
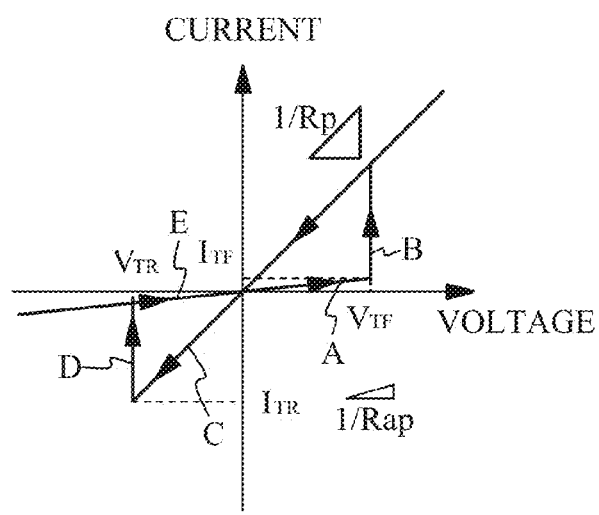
FIG. 1B is a diagram showing the current-voltage characteristics of the ferromagnetic tunnel junction element 40.
Figure 1C:
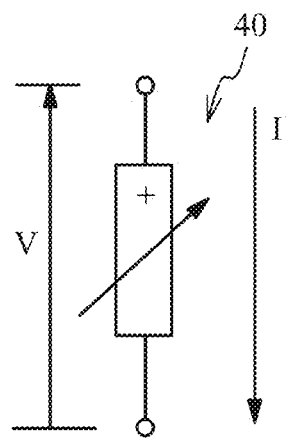

FIG. 1B is a diagram showing the current-voltage characteristics of the ferromagnetic tunnel junction element 40. As shown in FIG. 1A, a voltage that is applied to the ferromagnetic electrode free layer 42 with respect to the ferromagnetic electrode pinned layer 46 is defined as a voltage V, and a current flowing from the ferromagnetic electrode free layer 42 to the ferromagnetic electrode pinned layer 46 is defined as a current I. Symbols in the ferromagnetic tunnel junction element 40 at this point are defined as shown in FIG. 1C. As shown in FIG. 1B, the resistance Rp of the ferromagnetic tunnel junction element 40 in a parallel magnetization state is lower than the resistance Rap of the ferromagnetic tunnel junction element 40 in an antiparallel magnetization state. In general, Rp and Rap are functions of voltages applied to ferromagnetic tunnel junctions, but will be hereinafter regarded as resistances that have approximately constant resistance values. The following discussion applies even to cases where Rp and Rap are not constant resistances.

In an antiparallel magnetization state, when the voltage V to be applied to the ferromagnetic tunnel junction element 40 becomes higher, the current I increases at the rate equivalent to the reciprocal of the resistance Rap (A in FIG. 1B). When the current I exceeds a threshold current $I_{TF}$, the magnetization direction of the ferromagnetic electrode free layer 42 is reversed due to the majority-spin electrons of the ferromagnetic electrode pinned layer 46 injected from the ferromagnetic electrode pinned layer 46 into the ferromagnetic electrode free layer 42, and a parallel magnetization state appears (B in FIG. 1B). As a result, the resistance of the ferromagnetic tunnel junction element 40 becomes Rp. In a parallel magnetization state, when the current I flows (C in FIG. 1B) and exceeds the threshold current $I_{TR}$ in the negative direction, the minority-spin electrons of the ferromagnetic electrode free layer 42 among the electrons to be injected from the ferromagnetic electrode free layer 42 into the ferromagnetic electrode pinned layer 46 are reflected by the ferromagnetic electrode pinned layer 46. As a result, the magnetization direction of the ferromagnetic electrode free layer 42 is reversed, and an antiparallel magnetization state appears (D in FIG. 1B).

The method of reversing the magnetization direction of the ferromagnetic electrode free layer 42 by changing the magnetization direction through spin-polarized charge injection is called a spin-injection magnetization switching method. The spin-injection magnetization switching method has a higher possibility of reducing the power consumption required to change a magnetization direction than a method of changing a magnetization direction by generating a magnetic field. Also, unlike the method of changing a magnetization direction by generating a magnetic field, the spin-injection magnetization switching method does not have the problem of leakage magnetic fields. Accordingly, the spin-injection magnetization switching method is hardly affected by disturbances that cause inadvertent writing or erasing in cells other than selected cells, and is suitable for large-scale integration.

Figure 2:
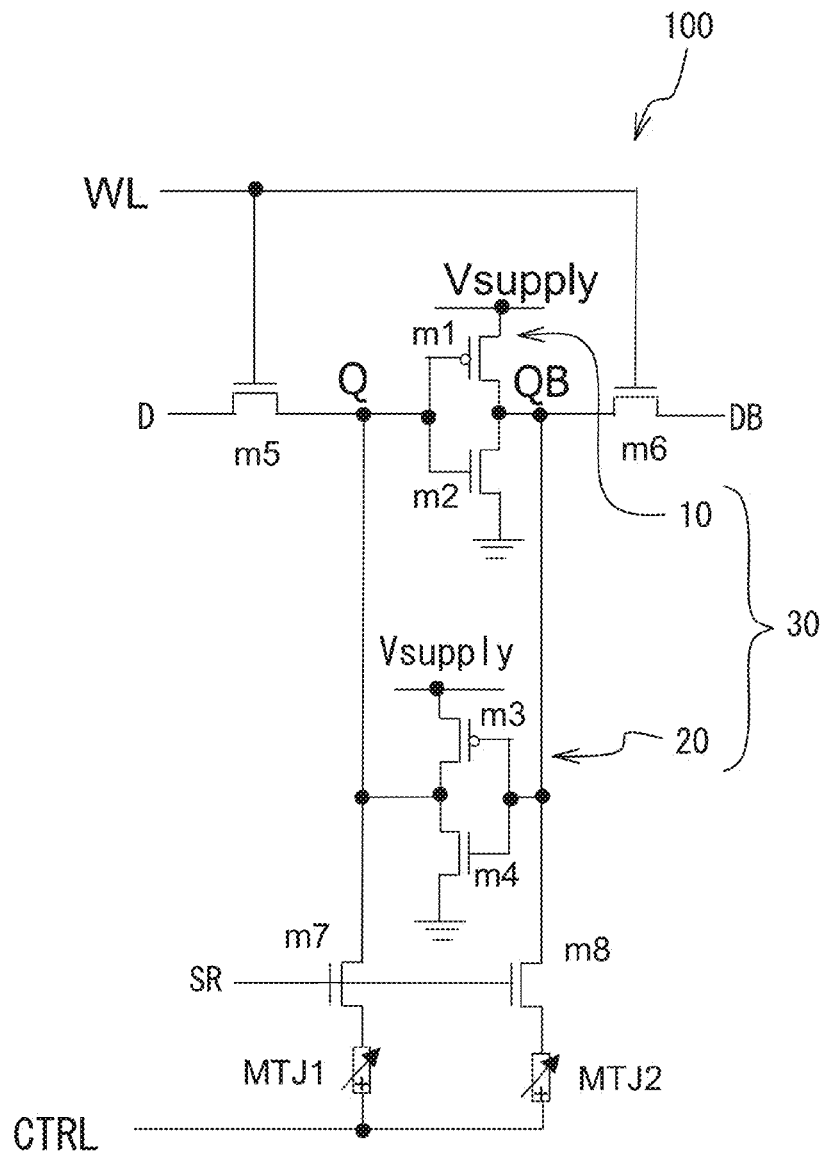
FIG. 2 is a circuit diagram of a memory cell.

Next, an example of a memory cell that includes a bistable circuit and ferromagnetic tunnel junction elements is described. FIG. 2 is a circuit diagram of the memory cell. As shown in FIG. 2, the memory cell 100 includes a first inverter circuit 10, a second inverter circuit 20, and ferromagnetic tunnel junction elements MTJ1 and MTJ2. The first inverter circuit 10 and the second inverter circuit 20 are connected in a ring-like manner, to form a bistable circuit 30. The first inverter circuit 10 includes an n-MOSFET (Metal Oxide Semiconductor Field Effect Transistor) m2 and a p-MOSFET m1. The second inverter circuit 20 includes an n-MOSFET m4 and a p-MOSFET m3.

The nodes to which the first inverter circuit 10 and the second inverter circuit 20 are connected are nodes Q and QB. The node Q and the node QB are complementary to each other, and the bistable circuit 30 is put into a stable state when the node Q and the node QB are at a high level and a low level, respectively, or when the node Q and the node QB are at a low level and a high level, respectively. The bistable circuit 30 is capable of storing data when in a stable state.

The nodes Q and QB are connected to input/output lines D and DB via MOSFETs m5 and m6, respectively. The gates of the MOSFETs m5 and m6 are connected to a word line WL. The MOSFETs m1 through m6 form a 6-MOSFET SRAM.

An FET m7 and the ferromagnetic tunnel junction element MTJ1 are connected between the node Q and a control line CTRL, and an FET m8 and the ferromagnetic tunnel junction element MTJ2 are connected between the node QB and the control line CTRL. One of the source and the drain of each of the FETs m7 and m8 is connected to the node Q/QB, and the other one of the source and the drain is connected to the ferromagnetic tunnel junction element MTJ1/MTJ2. The gates of the FETs m7 and m8 are connected to a switch line SR. Each of the FETs m7 and m8 may be connected between the ferromagnetic tunnel junction element MTJ1/MTJ2 and the control line CTRL. That is, the source and the drain of each of the FETs m7 and m8 should be connected in series to the ferromagnetic tunnel junction element MTJ1/MTJ2 between the nodes Q/QB and the control line CTRL. Alternatively, the FETs m7 and m8 may not be provided.

Data is written into and read from the bistable circuit 30 in the same manner as with a conventional SRAM. Specifically, the word line WL is set at a high level to put the FETs m5 and m6 into a conduction state, and data in the input/output lines D and DB is written into the bistable circuit 30. The input/output lines D and DB are put into an equipotential floating state, and the word line WL is set at a high level to put the FETs m5 and m6 into a conduction state. In this manner, data in the bistable circuit 30 can be read into the input/output lines D and DB. Data is held in the bistable circuit 30 by putting the FETs m5 and m6 into a cut-off state. When data writing, reading, or holding is performed in the bistable circuit 30, it is preferable to set the switch line SR at a low level, and put the FETs m7 and m8 into a cut-off state. As a result, the current flowing between the nodes Q and QB and the control line CTRL can be reduced, and power consumption can be lowered.

Figure 3:
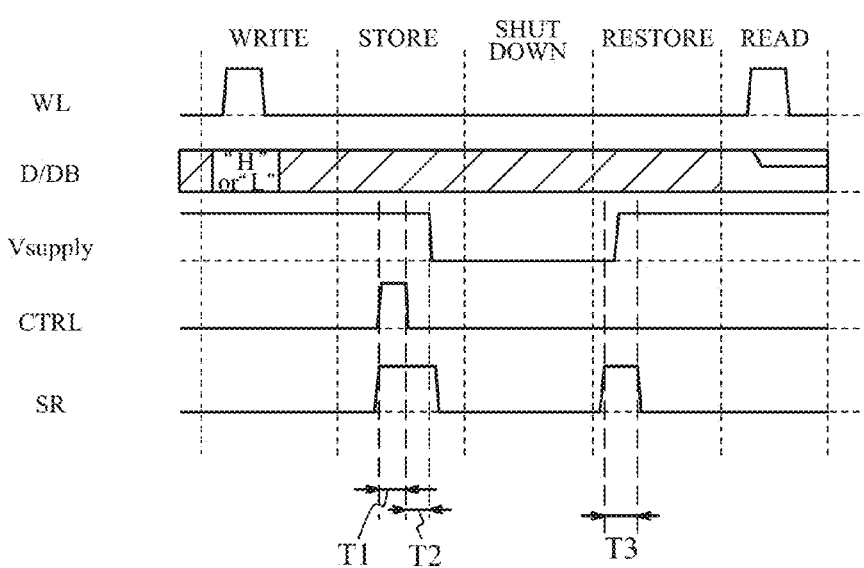
FIG. 3 is a timing chart showing control of the memory cell.

FIG. 3 is a timing chart illustrating control of the memory cell. The shaded region indicates a region in which it is not clear whether the level is high or low. As shown in FIG. 3, a supply voltage Vsupply is supplied, and the control line CTRL and the switch line SR are at a low level in initial condition. Data is written into the bistable circuit 30 by setting the word line WL at a high level and setting the input/output lines D and DB at a high and low level, respectively, or at a low and high level, respectively. Data is stored from the bistable circuit 30 into the ferromagnetic tunnel junction elements MTJ1 and MTJ2 by setting the switch line SR and the control line CTRL at a high level during a time period T1, and setting the switch line SR and the control line CTRL at a high level and low level, respectively during a time period T2.

When the nodes Q and QB are at a high level and a low level, respectively, the ferromagnetic tunnel junction elements MTJ1 and MTJ2 have a high resistance and a low resistance, respectively, at the end of T2. When the nodes Q and QB are at a low level and a high level, respectively, the ferromagnetic tunnel junction elements MTJ1 and MTJ2 have a low resistance and a high resistance, respectively, at the end of T2. In this manner, data in the bistable circuit 30 is stored into the ferromagnetic tunnel junction elements MTJ1 and MTJ2.

After that, the supply voltage Vsupply is set at 0 V, to put the memory cell into a shut-down state. As any current does not flow in the memory cell at this point, power consumption can be lowered. Data is restored into the bistable circuit 30 from the ferromagnetic tunnel junction elements MTJ1 and MTJ 2 by raising the supply voltage Vsupply from 0 V while maintaining the control line CTRL at a low level and the switch line SR at a high level during a time period T3.

When the ferromagnetic tunnel junction elements MTJ1 and MTJ2 have a high resistance and a low resistance, respectively, the nodes Q and QB are at a high level and a low level, respectively, at the end of T3. When the ferromagnetic tunnel junction elements MTJ1 and MTJ2 have a low resistance and a high resistance, respectively, the nodes Q and QB are at a low level and a high level, respectively, at the end of T3. In this manner, data stored in the ferromagnetic tunnel junction elements MTJ1 and MTJ2 in a nonvolatile manner is restored into the bistable circuit.

Data is read from the bistable circuit 30 by setting the word line WL at a high level.

Figure 4A:
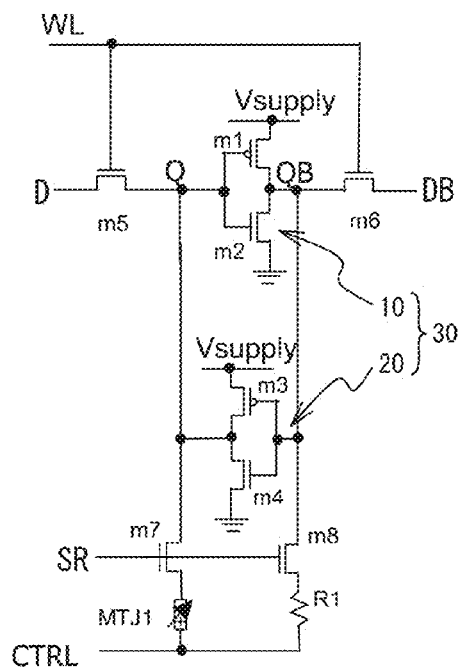
FIGS. 4A and 4B are circuit diagrams showing other examples of memory cells.
Figure 4B:
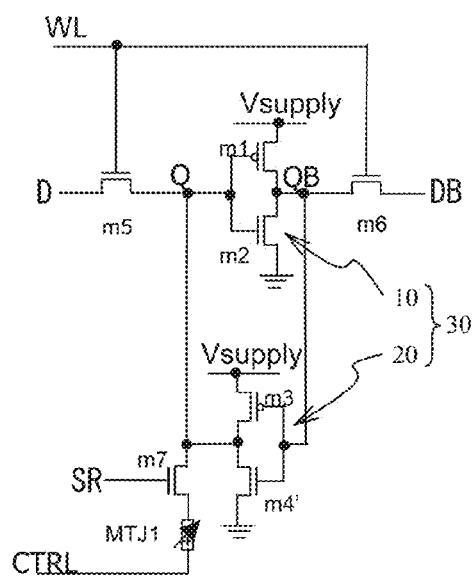

FIGS. 4A and 4B are diagrams showing other examples of memory cells. As shown in FIG. 4A, a resistor R1 can be used in place of the ferromagnetic tunnel junction element MTJ2. As shown in FIG. 4B, the node QB and the control line CTRL are not connected to each other. As shown in FIGS. 4A and 4B, the ferromagnetic tunnel junction element may be connected only between one of the nodes Q and QB and the control line CTRL. The FET m7 may be connected between the ferromagnetic tunnel junction element MTJ1 and the control line CTRL in each case. Alternatively, the FET m7 may not be provided. In each of the embodiments described below, the memory cell 100 shown in FIG. 2 will be described as an example, but either of the memory cells shown in FIGS. 4A and 4B may be used instead. Although ferromagnetic tunnel junction elements will be described as an example of nonvolatile elements, some other nonvolatile elements such as resistive switching memory elements, phase-change memory elements, or ferroelectric memory elements may be used instead.

First Embodiment

Figure 5A:
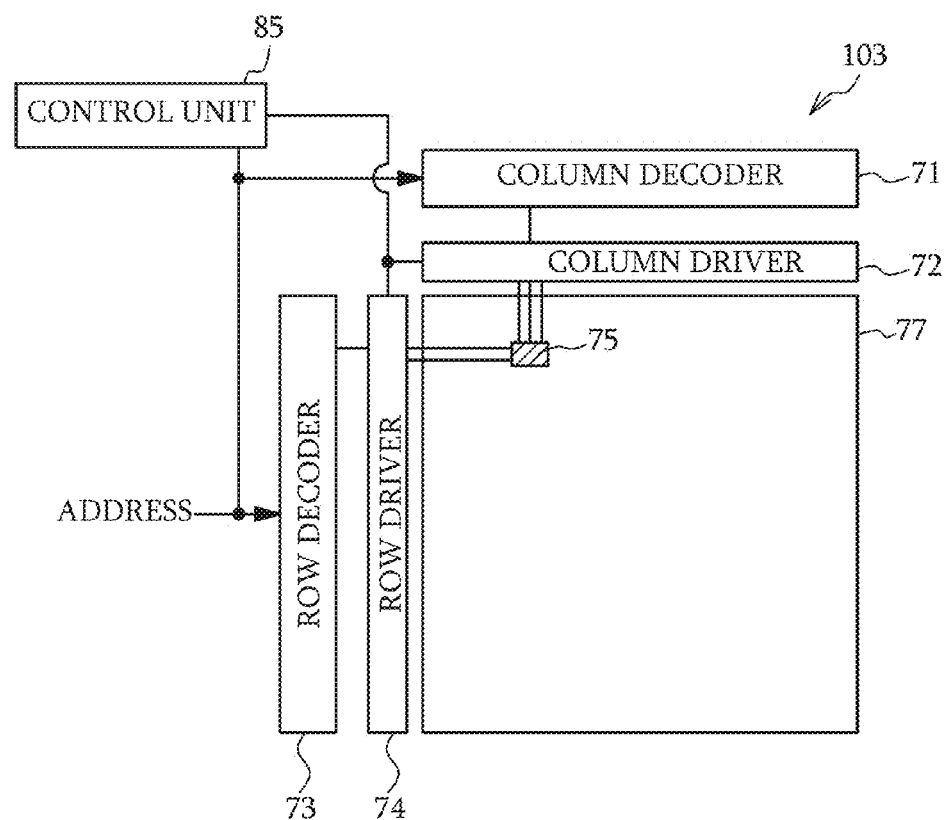
FIGS. 5A and 5B are block diagrams showing a memory circuit and a memory cell according to a first embodiment.
Figure 5B:
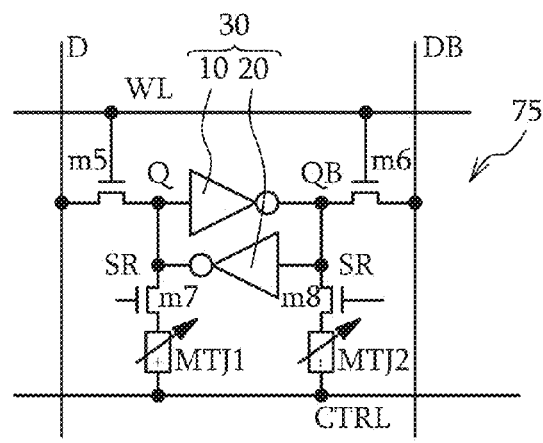

FIGS. 5A and 5B are block diagrams showing a memory circuit and a memory cell according to a first embodiment. As shown in FIG. 5A, a memory circuit 103 includes a memory area 77, a column decoder 71, a column driver 72, a row decoder 73, a row driver 74, and a control unit 85. In the memory area 77, memory cells 75 are arranged in a matrix fashion. The column decoder 71 and the row decoder 73 select a column and a row in accordance with an address signal. The column driver 72 applies a voltage or the like to the input/output lines D and DB of a selected column and the control line CTRL. The row driver 74 applies a voltage or the like to the word line WL of a selected row, the switch line SR, and the control line CTRL. The control unit 85 applies a voltage or the like to the input/output lines D and DB, the word line WL, the switch line SR, and the control line CTRL of a memory cell 75, via the column decoder 71, the column driver 72, the row decoder 73, and the row driver 74. When the column driver 72 applies a voltage to a control line, the control line is connected to each corresponding memory cell. As shown in FIG. 5B, the memory cells 75 are the same as the memory cell 100 shown in FIG. 2, for example.

When the row driver 74 applies a voltage to a control line CTRL, the control line CTRL is connected to the memory cells 75 arranged in one row. When the column driver 72 applies a voltage to a control line CTRL, the control line CTRL is connected to the memory cells 75 arranged in a column, for example.

Figure 6:
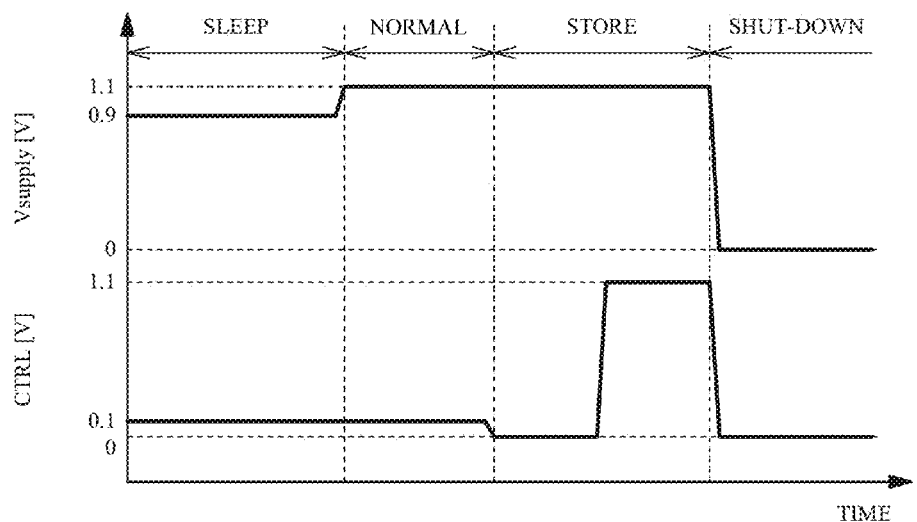
FIG. 6 is a timing chart showing the voltages of a power supply and a control line.

FIG. 6 is a timing chart showing the voltages of a power supply and a control line. As shown in FIG. 6, the time period during which data is held in the bistable circuit 30 is formed with a sleep period and a normal period. The normal period is the time period during which data in the bistable circuit 30 is read and rewritten in a volatile manner. The sleep period is the time period during which data in the bistable circuit 30 is only held, and is not read and rewritten. During the sleep period, the supply voltage Vsupply to be supplied to the bistable circuit 30 is made lower than that during the normal period so that data can be held. For example, Vsupply during the normal period is set at 1.1 V, and Vsupply during the sleep period is set at 0.9 V. With this arrangement, power consumption can be lowered.

If the voltage of the control line CTRL during the sleep period and the normal period is 0 V (a low-level voltage), power consumption increases due to leakage current from the MOSFETs m7 and m8. Therefore, the voltage of the control line CTRL is made higher than 0 V. Accordingly, leakage current from the MOSFETs m7 and m8 can be reduced, and power consumption can be lowered.

During the store period, the voltage of the control line CTRL is set at 0 V, and thereafter, is set at 1.1 V. During the shut-down period, both the supply voltage Vsupply and the control line CTRL are set at 0 V.

Figure 7:
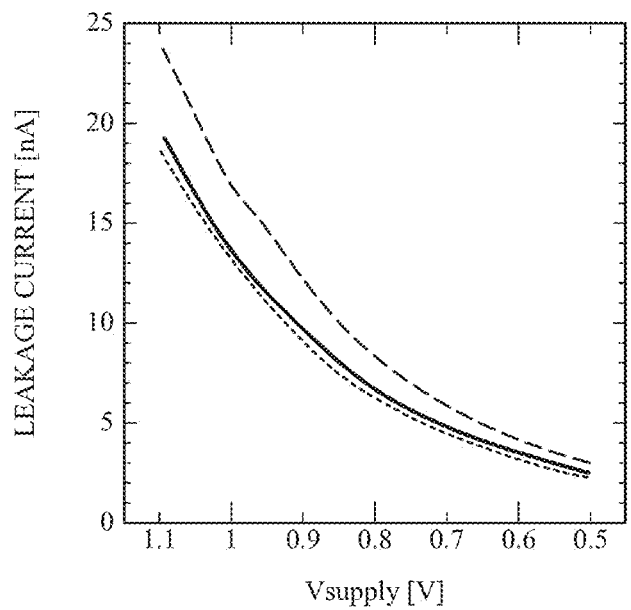
FIG. 7 is a diagram showing the results of simulations performed to simulate leakage currents from memory cells relative to a power supply.

FIG. 7 is a diagram illustrating simulations performed to simulate leakage currents from memory cells with respect to a power supply. The dotted line indicates the leakage current of a 6-transistor SRAM (6T-SRAM) cell that is the same as the one shown in FIG. 5B, except that the MOSFETs m7 and m8, and the ferromagnetic tunnel junction elements MTJ1 and MTJ2 are not provided. The dashed line indicates the leakage current in a case where the voltage of the control line CTRL is set at 0 V, and the solid line indicates the leakage current in a case where the voltage of the control line CTRL is set at 0.1 V. As shown in FIG. 7, power consumption by a memory cell can be lowered by controlling the voltage of the control line CTRL.

Figure 8:
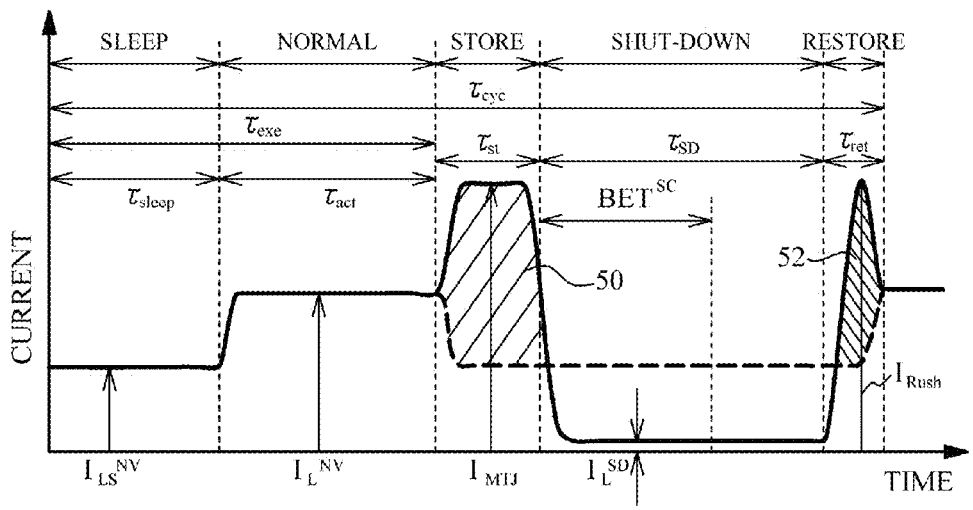
FIG. 8 is a schematic diagram showing a comparison between a shut-down state and a sleep state in terms of current consumption in the memory circuit according to the first embodiment.
Figure 9:
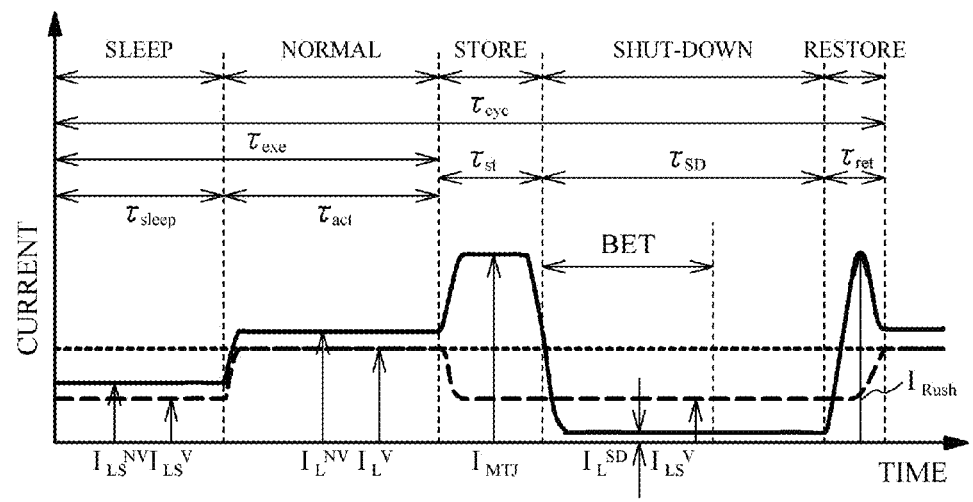
FIG. 9 is a schematic diagram showing a comparison between the memory circuit according to the first embodiment and a 6T-SRAM in terms of current consumption.

FIG. 8 is a schematic diagram showing a comparison between a shut-down state and a sleep state in terms of current consumption in the memory circuit according to the first embodiment. FIG. 9 is a schematic diagram showing a comparison between the memory circuit according to the first embodiment and a 6T-SRAM in terms of current consumption. The solid line in FIG. 8 indicates the current consumption in each time period in the memory circuit 103. The dashed line in FIG. 8 indicates the current consumption in a case where the memory cell 75 is not shut down but is put into a sleep state. In FIG. 9, the solid line indicates the current consumption in each time period in the memory circuit 103. The dashed line indicates the current consumption by a memory circuit using 6T-SRAM cells. The dotted line indicates the current consumption in the normal period in a memory circuit using 6T-SRAM cells.

The length of the sleep period is represented by $\tau_{sleep}$, the current in a 6T-SRAM is represented by $I_{LS}^V$, and the current in the first embodiment is represented by $I_{LS}^{NV}$. The length of the normal period is represented by $\tau_{act}$, the current in the 6T-SRAM is represented by $I_L^V$, and the current in the first embodiment is represented by $I_L^{NV}$. The length of the store period is represented by $\tau_{st}$, and the current is represented by $I_{MTJ}$. The length of the shut-down period is represented by $\tau_{SD}$, and the current in first embodiment is represented by $I_L^{SD}$. The length of the restore period is represented by $\tau_{ret}$, and the current in first embodiment is represented by $I_{Rush}$. The total length of the sleep period and the normal period is represented by $\tau_{exe}$. The length from the sleep period to the restore period is represented by $\tau_{cyc}$.

As shown in FIG. 9, in the sleep period and the regular period, leakage current flows in the MOSFETs m7 and m8, and therefore, the power consumption by the memory circuit 103 of the first embodiment is larger than that by the 6T-SRAM. In the store period and the restore period, current flows in the ferromagnetic tunnel junction elements MTJ1 and MTJ2, and therefore, the power consumption in the first embodiment becomes larger. In the shut-down period, a very small amount of leakage current flows in the memory circuit 103 of the first embodiment, but the power consumption becomes sufficiently smaller. Since the 6T-SRAM cannot be shut down, total of the store period, the shut-down period, and the restore period form the sleep period.

Figure 10:
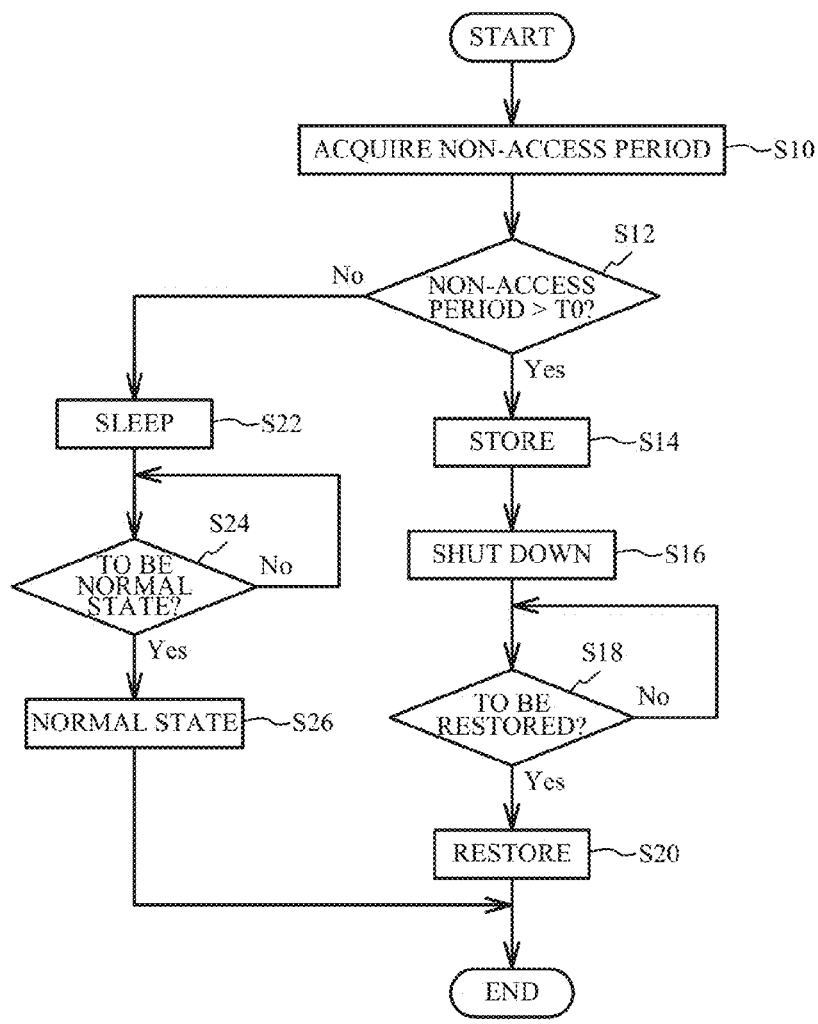
FIG. 10 is a flowchart showing control by the control unit.

FIG. 10 is a flowchart showing the control by the control unit. FIG. 10 shows the control to be performed in a case where there is a non-access period during which data is not read from or written into the bistable circuit 30. The control unit 85 acquires the non-access period (step S10). The non-access period is acquired from a CPU (Central Processing Unit) or the like that controls the memory circuit 103, for example. The control unit 85 determines whether the non-access period is longer than a predetermined time period T0 (step S12). If the determination result indicates "Yes", the control unit 85 stores data in the bistable circuit 30 into the ferromagnetic tunnel junction elements MTJ1 and MTJ2 (step S14). After that, the control unit 85 performs shutting-down by cutting off the supply voltage Vsupply (step S16). The control unit 85 determines whether to perform restoring (step S18). If the non-access period has passed, or where a signal to access the memory cell 75 is acquired from the CPU or the like, for example, the control unit 85 determines to perform restoring. If the determination result indicates "Yes", the control unit 85 restores the data stored in the ferromagnetic tunnel junction elements MTJ1 and MTJ2 into the bistable circuit 30 (step S20). After that, the operation comes to an end. If the determination result indicates "No", the operation returns to step S18.

If the determination result of step S12 indicates "No", the control unit 85 lowers the supply voltage Vsupply for the bistable circuit 30, to put the memory cell 75 into a sleep state (step S22). The control unit 85 determines whether to put the bistable circuit 30 back into a normal state (step S18). In a case where the non-access period has passed, or where a signal to access the memory cell 75 is acquired from the CPU or the like, for example, the control unit 85 determines to put the bistable circuit 30 back into a normal state (step S24). If the determination result indicates "Yes", the control unit 85 puts the supply voltage Vsupply for the bistable circuit 30 back into a normal state, to put the memory cell 75 into a normal state (step S26). The operation then comes to an end. If the determination result indicates "No", the operation returns to step S24.

According to the first embodiment, when the non-access period is longer than the predetermined time period T0, the control unit 85 stores data written in the bistable circuit 30 in a nonvolatile manner, and cuts off the power supply to the bistable circuit 30, as in steps S14 and S16. When the non-access period is shorter than the predetermined time period T0, data written in the bistable circuit 30 is not stored in a nonvolatile manner, but the supply voltage Vsupply for the bistable circuit 30 is made lower than the voltage to be used in reading data from or writing data into the bistable circuit 30, as in step S22. That is, the memory cell 75 is put into a sleep state. As shown in FIG. 8, current consumption increases during the store period and restore period. Therefore, when the non-access period is shorter, total power consumption can be lowered in a sleep state without shutting-down. When the non-access period is longer, on the other hand, the total power consumption can be lowered by shutting-down. Accordingly, power consumption can be lowered in the first embodiment.

As the predetermined time period T0, a self-compared break-even period ($BET^{SC}$) can be used. $BET^{SC}$ is a shut-down period such that the power consumption in a case where the memory cell is shut down during the non-access period becomes equal to the power consumption in a case where the memory cell is put into a sleep state during the non-access period. For example, $BET^{SC}$ is such a time period that the power consumed when the predetermined time period T0 is the sleep period is equal to the sum of the power consumed during the period to store data into and restore data from the ferromagnetic tunnel junction elements MTJ1 and MTJ2 and the power consumed by the leakage current in a case where the memory cell is shut down during the predetermined time period. To reduce power consumption by the memory circuit 103, the length of the predetermined time period T0 is preferably set to a length that is equal to or longer than the length of $BET^{SC}$.

The leakage current during the shut-down period is the current that flows to prevent the supply voltage from becoming 0 V even when the power supply to the bistable circuit 30 is cut off, for example. Other than that, the leakage current includes the current that flows during the shut-down period. For example, the supply voltage Vsupply during the shut-down period is made 0 V by providing a sleep transistor between the supply voltage Vsupply and the power supply, and switching off the sleep transistor. If there is a small amount of leakage current from the sleep transistor, the leakage current also flows in the memory cell. Therefore, there are cases where the leakage current during the shut-down period cannot be made zero.

If the power consumption due to the leakage current during the shut-down period is ignorable, $BET^{SC}$ can be a time period during which the power consumption in a case where a sleep state lasts during the predetermined time period T0 is equal to the power consumption during the period to store data into and restore data from the ferromagnetic tunnel junction elements MTJ1 and MTJ2.

In FIG. 8, a region 50 represents a difference between the current in a storing case and the current in a sleep state. A region 52 represents a difference between the current in a restoring case and the current in a sleep state. The energy equivalent to the region 50 (the energy calculated by subtracting the energy in a case where the memory cell 75 is put into a sleep state during the store period from the energy for storing data into the ferromagnetic tunnel junction elements) is represented by $E_{store}^{SC}$, and the energy equivalent to the region 52 (the energy calculated by subtracting the energy in a case where the memory cell 75 is put into a sleep state during the restore period from the energy for restoring data from the ferromagnetic tunnel junction elements) is represented by $E_{restore}^{SC}$. The current consumption during the sleep period is represented by $I_{LS}^{NV}$, the current consumption during the shut-down period is represented by $I_L^{SD}$, the supply voltage for of the bistable circuit 30 during the sleep period is represented by $V_{sleep}$ or $V_{DD}$, the supply voltage for the bistable circuit 30 during the shut-down period is represented by $V_{SD}$, $V_{sleep}$ or $V_{DD}$, and the power supply for the bistable circuit 30 is represented by $V_{DD}$. When the supply voltage for the bistable circuit 30 during the sleep period and the shut-down period is $V_{sleep}$, the period $BET^{SC}$ can be expressed by Mathematical Formula 1-1.

$$BET^{SC} = \frac{E_{store}^{SC} + E_{restore}^{SC}}{(I_{LS}^{NV} - I_L^{SD})V_{sleep}} \quad \text{[Mathematical Formula 1-1]}$$

When the supply voltage for the bistable circuit 30 during the sleep period and the shut-down period is $V_{DD}$, the period $BET^{SC}$ can be expressed by Mathematical Formula 1-2.

$$BET^{SC} = \frac{E_{store}^{SC} + E_{restore}^{SC}}{(I_{LS}^{NV} - I_L^{SD})V_{DD}} \quad \text{[Mathematical Formula 1-2]}$$

When the supply voltages for the bistable circuit 30 during the sleep period and the shut-down period are $V_{sleep}$ and $V_{SD}$, respectively, the period $BET^{SC}$ can be expressed by Mathematical Formula 1-3.

$$BET^{SC} = \frac{E_{store}^{SC} + E_{restore}^{SC}}{I_{LS}^{NV} V_{sleep} - I_L^{SD} V_{SD}} \quad \text{[Mathematical Formula 1-3]}$$

In FIG. 9, the energy calculated by subtracting the energy during the time period corresponding to the sleep state of the 6T-SRAM from the necessary energy for storing is represented by $E_{store}$, and the energy calculated by subtracting the energy during the time period corresponding to the sleep state of the 6T-SRAM from the necessary energy for restoring is represented by $E_{restore}$. The duty ratio during the sleep period is represented by $r_{sleep} = (\tau_{sleep}/\tau_{exe})$. When $\eta_L^{NV} = (I_L^{NV} - I_L^V)/(I_{LS}^V - I_L^{SD})$, $\eta_{LS}^{NV} = (I_{LS}^{NV} - I_{LS}^V)/(I_{LS}^V - I_L^{SD})$, and the supply voltage for the bistable circuit 30 during the sleep period and the shut-down period is $V_{sleep}$, the break-even period BET relative to that of the 6T-SRAM can be expressed by Mathematical Formula 2-1.

$$BET = \frac{E_{store} + E_{restore}}{(I_{LS}^V - I_L^{SD})V_{sleep}} + \quad \text{[Mathematical Formula 2-1]}$$
$$\eta_{LS}^{NV} r_{sleep} \tau_{exe} + \eta_L^{NV} \frac{V_{DD}}{V_{sleep}} (1 - r_{sleep}) \tau_{exe}$$

When $\eta_L^{NV} = (I_L^{NV} - I_L^V)/(I_{LS}^V - I_L^{SD})$, $\eta_{LS}^{NV} = (I_{LS}^{NV} - I_{LS}^V)/(I_{LS}^V - I_L^{SD})$, the supply voltage for the bistable circuit 30 during the sleep period and the shut-down period is $V_{DD}$, the break-even period BET can be expressed by Mathematical Formula 2-2.

$$BET = \frac{E_{store} + E_{restore}}{(I_{LS}^V - I_L^{SD})V_{DD}} + \quad \text{[Mathematical Formula 2-2]}$$
$$\eta_{LS}^{NV} r_{sleep} \tau_{exe} + \eta_L^{NV} (1 - r_{sleep}) \tau_{exe}$$

When $\eta_L^{NV} = (I_L^{NV} - I_L^V)/(I_{LS}^V V_{sleep}/V_{DD} - I_L^{SD} V_{SD}/V_{DD})$, $\eta_{LS}^{NV} = (I_{LS}^{NV} - I_{LS}^V)/(I_{LS}^V - I_L^{SD} V_{SD}/V_{sleep})$, and the supply voltages for the bistable circuit 30 during the sleep period and the shut-down period are $V_{sleep}$ and $V_{SD}$, respectively, the break-even period BET can be expressed by Mathematical Formula 2-3.

$$BET = \frac{E_{store} + E_{restore}}{I_{LS}^V V_{sleep} - I_L^{SD} V_{SD}} + \quad \text{[Mathematical Formula 2-3]}$$
$$\eta_{LS}^{NV} r_{sleep} \tau_{exe} + \eta_L^{NV} (1 - r_{sleep}) \tau_{exe}$$

As described above, when the memory circuit according to the first embodiment is compared with a 6T-SRAM in terms of power consumption, a greater power saving effect than that of the 6T-SRAM can be achieved with the time period BET or longer.

In the first embodiment, an example case where the ferromagnetic tunnel junction elements MTJ1 and MTJ2 are connected between the bistable circuit 30 and the control line CTRL has been described. However, some other circuit structure may be used, as long as data can be stored into a nonvolatile element such as a ferromagnetic tunnel junction element in a nonvolatile manner. For example, a ferromagnetic tunnel junction element may be provided between one of the nodes Q and QB in the bistable circuit 30 and the control line CTRL, as shown in FIGS. 4A and 4B.

In the case of a nonvolatile element that stores data written in the bistable circuit 30 in a nonvolatile manner by using a current flowing between both ends as in a ferromagnetic tunnel junction element, the current consumption during the store period is large. Therefore, it is preferable to determine whether to shut down the memory cell based on a comparison between the non-access period and the predetermined time period.

As shown in FIG. 7, the control unit 85 performs control so that the voltage of the control line CTRL during the period for the bistable circuit 30 to store data (the sleep period and the normal period) becomes higher than the lowest voltage to be applied to the control line CTRL during the period to store the data written in the bistable circuit 30 into a nonvolatile element in a nonvolatile manner (the store period). In this manner, power consumption by the memory cell 75 can be lowered.

Also, as shown in FIG. 7, the control unit 85 performs control so that the voltage of the control line CTRL during the period for the bistable circuit 30 to store data becomes higher than the voltage of the control line CTRL during the period to cut off the power supply to the bistable circuit 30 (the shut-down period). In this manner, power consumption by the memory cell can be lowered.

Second Embodiment

Figure 11:
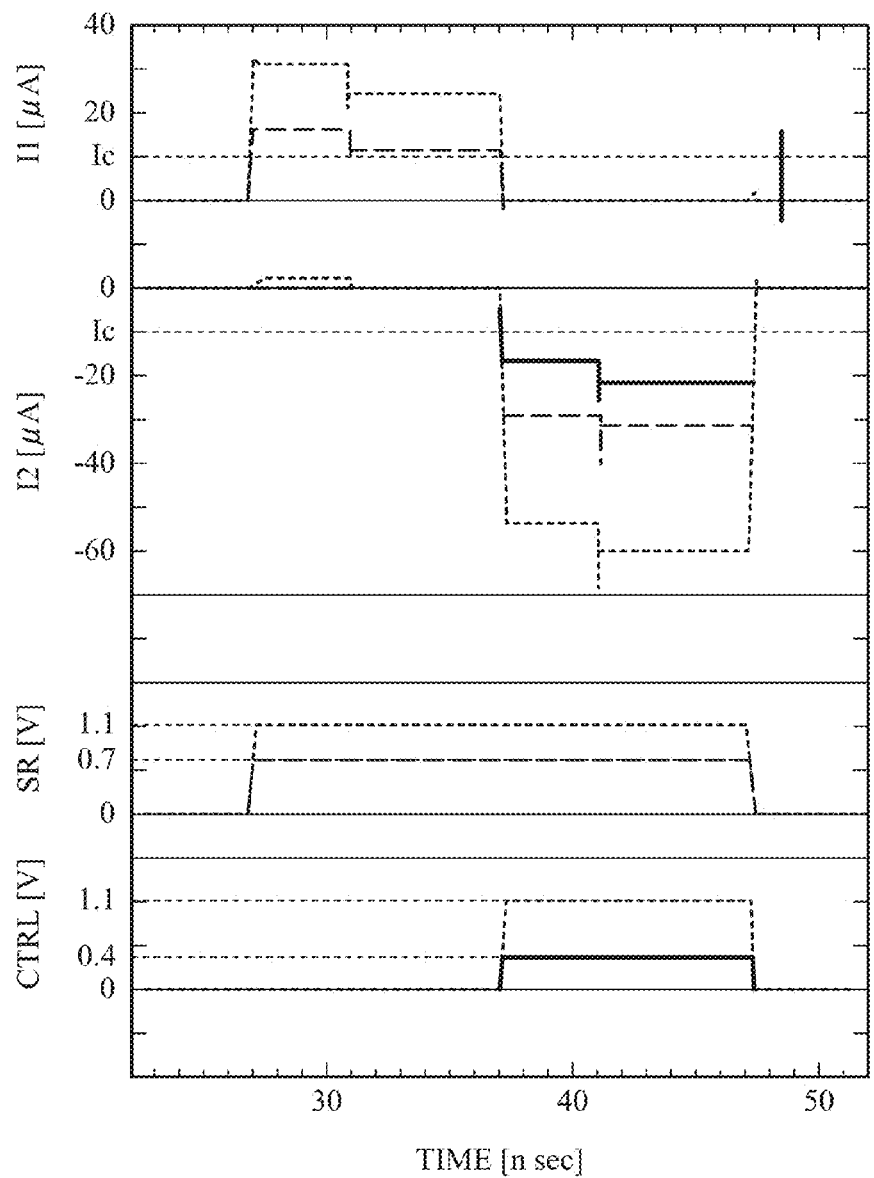
FIG. 11 is a timing chart showing simulations performed to simulate the voltages of a control line CTRL and a switch line SR during a store period, and currents I1 and I2 flowing in ferromagnetic tunnel junction elements MTJ1 and MTJ2 during the store period.

The structure of a memory circuit of a second embodiment is the same as that of the first embodiment illustrated in FIG. 5, and therefore, explanation thereof is not repeated herein. FIG. 11 is a timing chart illustrating simulations performed to simulate the voltages of the control line CTRL and the switch line SR during the store period, and the currents I1 and I2 flowing in the ferromagnetic tunnel junction elements MTJ1 and MTJ2 during the store period. The simulations were performed in cases where the ferromagnetic tunnel junction element MTJ1 was switched from a low resistance to a high resistance, and the ferromagnetic tunnel junction element MTJ2 was switched from a high resistance to a low resistance. The dotted lines indicate a case where the voltages of the control line CTRL and the switch line SR were 1.1 V (VDD), the dashed lines indicate a case where the voltages of the control line CTRL and the switch line SR were 1.1 V and 0.7 V, respectively, and the solid lines indicate a case where the voltages of the control line CTRL and the switch line SR were 0.4 V and 0.7 V, respectively.

The currents I1 and I2 are positive currents when flowing from the bistable circuit 30 to the control line CTRL. A current Ic is the current with which the resistance of each ferromagnetic tunnel junction element changes. That is, when the absolute values of the currents I1 and I2 are greater than the current Ic, the resistance of each ferromagnetic tunnel junction element changes.

Even if the voltage of the switch line SR is set at 0.7 V and the current I1 flowing in the MOSFET m7 is made lower when the control line CTRL is at 0 V, the ferromagnetic tunnel junction element MTJ1 switches from a low resistance to a high resistance as long as the absolute value of the current I1 is greater than Ic. Even if the voltage of the switch line SR is set at 0.7 V and the absolute value of the current I2 flowing in the MOSFET m8 is made lower when a positive voltage is applied to the control line CTRL, the ferromagnetic tunnel junction element MTJ2 switches from a high resistance to a low resistance as long as the absolute value of I2 is greater than the absolute value of Ic. Furthermore, even if the voltage of the control line CTRL is set at 0.4 V, the ferromagnetic tunnel junction element MTJ2 switches from a high resistance to a low resistance. As described above, the voltages of the switch line SR and the control line CTRL are made lower, so that power consumption can be lowered, and storing can be performed.

The absolute value of the current I2 is greater than that of the current I1, because the source of the MOSFET m7 is connected to the control line CTRL via a resistor (a ferromagnetic tunnel junction element) while the source of the MOSFET m8 is connected to the node QB.

Figure 12A:
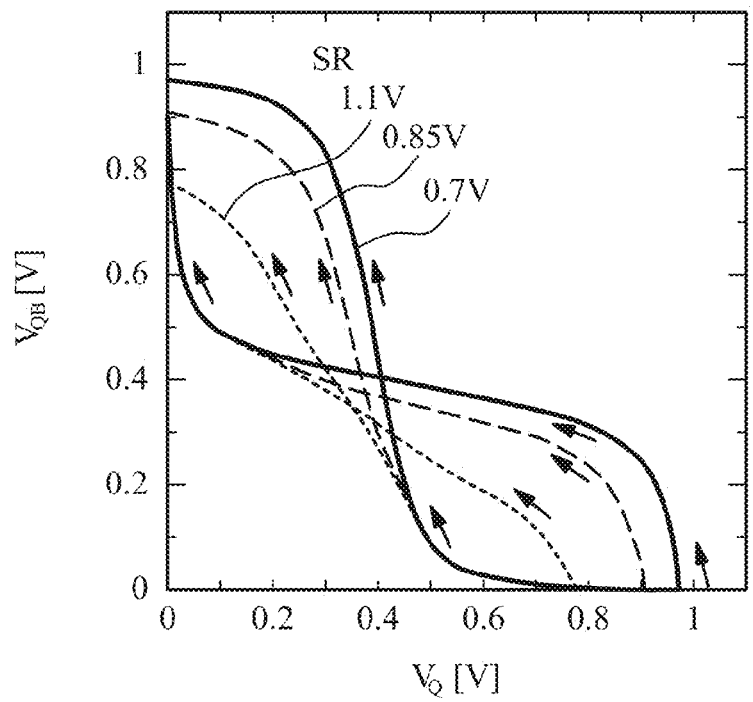
FIGS. 12A and 12B are diagrams each showing simulations performed to simulate characteristics of a bistable circuit during the store period.
Figure 12B:
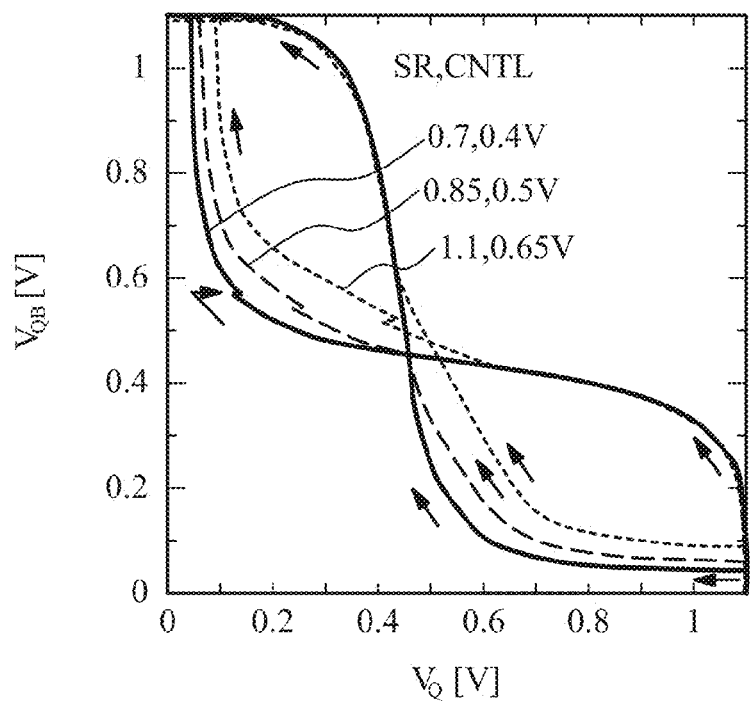

FIGS. 12A and 12B are diagrams each illustrating simulations performed to simulate characteristics of the bistable circuit during the store period. FIGS. 12A and 12B show the voltage of the node QB relative to the node Q when current is flowing in the ferromagnetic tunnel junction elements during the store period. The arrows indicate the scanning directions in the simulations. In FIG. 12A, the dotted lines, the dashed lines, and the solid lines indicate cases where the voltage of the switch line SR is 1.1 V, 0.85 V, and 0.7 V, respectively, when the ferromagnetic tunnel junction element MTJ1 is switched from a low resistance to a high resistance (or when the control line is at 0 V in FIG. 11). As shown in FIG. 12A, as the voltage of the switch line SR becomes lower, the noise margin of the bistable circuit 30 becomes wider.

In FIG. 12B, the solid lines, the dashed line, and the dotted lines indicate cases where the voltages of the switch line SR and the control line CTRL are 1.1 V and 0.65 V, 0.85 V and 0.5 V, and 0.7 V and 0.4 V, respectively, when the ferromagnetic tunnel junction element MTJ2 is switched from a high resistance to a low resistance (or when the control line is at a positive voltage in FIG. 11). As shown in FIG. 12B, as the voltages of the switch line SR and the control line CTRL become lower, the noise margin of the bistable circuit 30 becomes wider.

Third Embodiment

Figure 13:
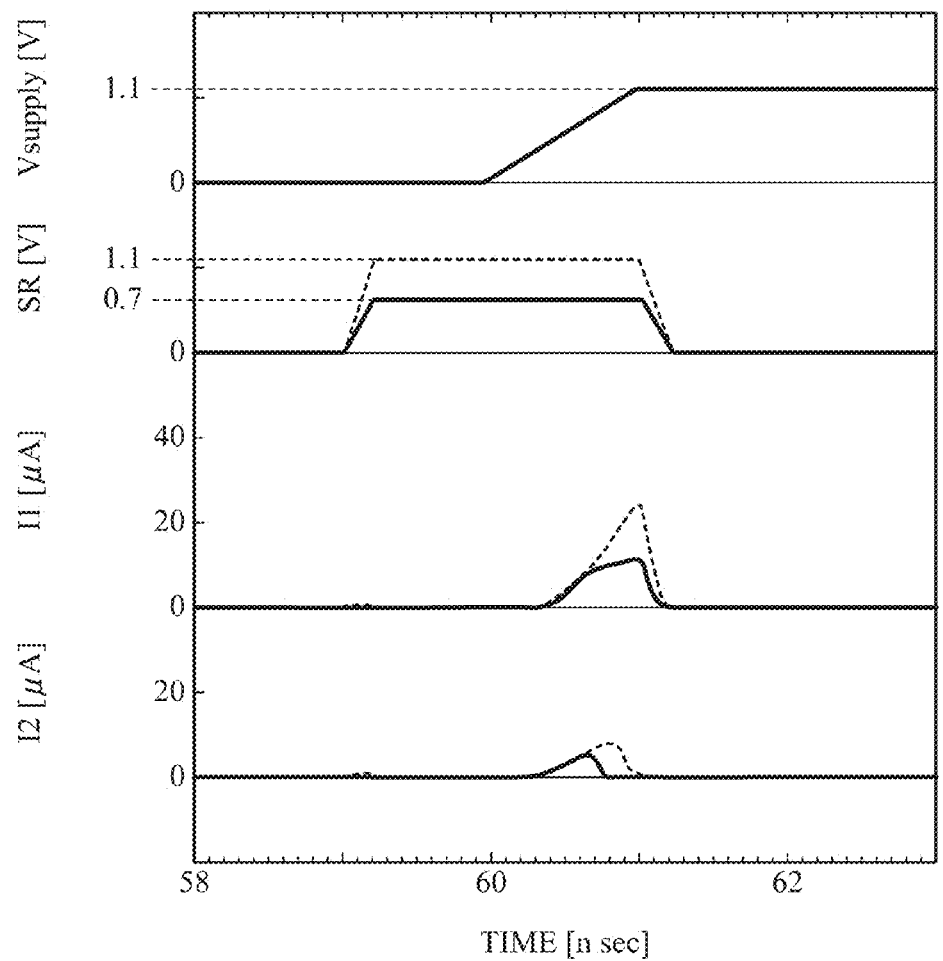
FIG. 13 is a timing chart showing simulations performed to simulate the voltages of a power supply Vsupply and the switch line SR during a restore period, and currents I1 and I2 flowing in the ferromagnetic tunnel junction elements MTJ1 and MTJ2 during the restore period.

The structure of a memory circuit of a third embodiment is the same as that of the first embodiment illustrated in FIGS. 5A and 5B, and therefore, explanation thereof is not repeated herein. FIG. 13 is a timing chart illustrating simulations performed to simulate the supply voltage Vsupply and the voltage of the switch line SR during the restore period, and the currents I1 and I2 flowing in the ferromagnetic tunnel junction elements MTJ1 and MTJ2 during the restore period. The simulations were performed in cases where the ferromagnetic tunnel junction element MTJ1 had a high resistance, and the ferromagnetic tunnel junction element MTJ2 had a low resistance. The dotted lines indicate a case where the voltage of the switch line SR was 1.1 V (VDD), and the solid lines indicate a case where the voltage of the switch line SR was 0.7 V. When the supply voltage Vsupply is rising, the solid line indicates a lower value than the dotted line in each of the cases with the currents I1 and I2. Accordingly, power consumption can be lowered.

Figure 14A:
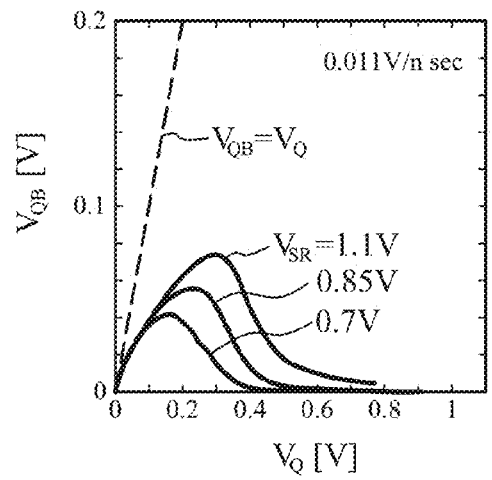
FIGS. 14A through 14C are diagrams each showing simulations performed to simulate changes in potential at nodes Q and QB during the restore period.
Figure 14B:
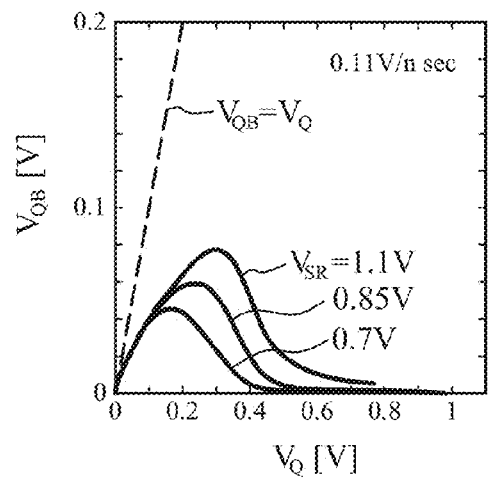
Figure 14C:
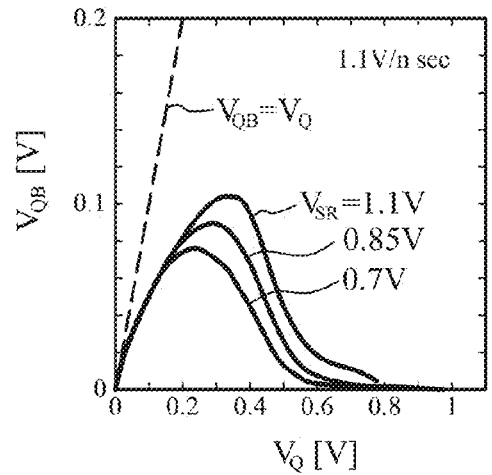

FIGS. 14A through 14C are diagrams each illustrating simulations performed to simulate changes in potential at the nodes Q and QB during the restore period. In the diagrams, the ferromagnetic tunnel junction elements MTJ1 and MTJ2 have a high resistance and a low resistance, respectively, and the voltage of the switch line SR is 1.1 V, 0.85 V, and 0.7 V.

FIGS. 14A through 14C correspond to cases where the increase rate of the supply voltage when the supply voltage Vsupply during the restore period is ramped up is 0.011 V/n sec, 0.11 V/n sec, and 1.1 V/n sec, respectively. At any of the increase rates, when the voltage of the switch line SR is 0.7 V, the voltage of the node QB does not become higher, and the voltage VQ of the node Q is restored at a high level. As described above, data is restored into the bistable circuit 30 in a more stable manner when the voltage of the switch line SR is low.

According to the second and third embodiments, the control unit 85 performs control so that the voltage to be applied to the gates of the MOSFETs m7 and m8 during the period to store data written in the bistable circuit 30 into a nonvolatile element in a nonvolatile manner (the store period) or during the period to restore data stored in a nonvolatile element in a nonvolatile manner into the bistable circuit 30 (the restore period) becomes lower than the supply voltage Vsupply to be applied to the bistable circuit 30 during the period to write data into and read data from the bistable circuit 30 in a volatile manner (the normal period). In this manner, power consumption can be lowered, and the bistable circuit 30 can be maintained in a stable state. Further, the bistable circuit 30 can also be maintained in a stable state by increasing the rate at which the supply voltage increases.

As in the third embodiment, the control unit 85 performs control so that the highest voltage to be applied to the control line CTRL during the store period becomes lower than the supply voltage Vsupply. In this manner, power consumption can be lowered, and the bistable circuit 30 can be maintained in a stable state.

Although preferred embodiments of the present invention have been described so far, the present invention is not limited to those particular embodiments, and various changes and modifications may be made to them within the scope of the invention claimed herein.

DESCRIPTION OF REFERENCE NUMERALS 10, 20 inverter
30 bistable circuit
85 control unit
MTJ1, MTJ2 ferromagnetic tunnel junction element

The invention claimed is:
1. A memory circuit comprising:
a bistable circuit configured to write data;
a nonvolatile element configured to store data written in the bistable circuit in a nonvolatile manner, and restore data stored in a nonvolatile manner into the bistable circuit; and
a control unit configured to store data written in the bistable circuit into the nonvolatile element in a nonvolatile manner and cut off a power supply to the bistable circuit when it is determined that a period not to read data from or write data into the bistable circuit is longer than a predetermined time period, and store no data written in the bistable circuit into the nonvolatile element in a nonvolatile manner and make a supply voltage for the bistable circuit lower than a voltage during a period to read data from or write data into the bistable circuit when it is determined that the period not to read or write data is shorter than the predetermined time period.

2. The memory circuit according to claim 1, wherein
the control unit determines whether the period not to read data from or write data into the bistable circuit is longer than the predetermined time period, when determining that the period not to read data from or write data into the bistable circuit is longer than the predetermined time period, the control unit stores data written in the bistable circuit into the nonvolatile element in a nonvolatile manner, and cuts off the power supply to the bistable circuit, and when determining that the period not to read or write data is shorter than the predetermined time period, the control unit does not store data written in the bistable circuit into the nonvolatile element in a nonvolatile manner, and makes the supply voltage for the bistable circuit lower than the voltage during the period to read data from or write data into the bistable circuit.

3. The memory circuit according to claim 1, wherein the nonvolatile element has one end connected to a node in the bistable circuit, and has the other end connected to a control line.

4. The memory circuit according to claim 3, wherein the nonvolatile element stores data written in the bistable circuit in a nonvolatile manner by using a current flowing between the one end and the other end.

5. The memory circuit according to any one of claim 3, wherein the predetermined time period is equal to or longer than $(E_{store}^{SC} + E_{restore}^{SC} / ((I_{LS}^{NV} - I_{L}^{SD}) \times V_{sleep})$, $E_{store}^{SC}$ representing an energy calculated by subtracting an energy in a case where the supply voltage for the bistable circuit is lowered during a period to store data into the nonvolatile element, from an energy for storing data into the nonvolatile element, $E_{restore}^{SC}$ representing an energy calculated by subtracting an energy in a case where the supply voltage for the bistable circuit is lowered during a period to restore data from the nonvolatile element, from an energy for restoring data from the nonvolatile element, $I_{LS}^{NV}$ representing a current consumed in a case where the supply voltage for the bistable circuit is lowered, $I_{L}^{SD}$ representing a current consumed in a case where the power supply to the bistable circuit is cut off, $V_{sleep}$ representing a supply voltage in a case where the supply voltage for the bistable circuit is lowered.

6. The memory circuit according to claim 1, further comprising:
a MOSFET having a source and a drain connected in series to the nonvolatile element between the node and the control line; and
a control unit configured to make a voltage of the control line during a period for the bistable circuit to store data higher than the lowest voltage to be applied to the control line during a period to store data written in the bistable circuit into the nonvolatile element in a nonvolatile manner.

7. The memory circuit according to claim 6, wherein the control unit makes the voltage of the control line during the period for the bistable circuit to store data higher than a voltage of the control line during a period to cut off the power supply to the bistable circuit.

8. The memory circuit according to claim 1, wherein the nonvolatile element is a ferromagnetic tunnel junction element.

9. A memory circuit comprising:
a bistable circuit configured to write data;
a nonvolatile element configured to store data written in the bistable circuit in a nonvolatile manner, and restore data stored in a nonvolatile manner into the bistable circuit; and
a control unit configured to store data written in the bistable circuit into the nonvolatile element in a nonvolatile manner and cut off a power supply to the bistable circuit when a period not to read data from or write data into the bistable circuit is longer than a predetermined time period, and store no data written in the bistable circuit into the nonvolatile element in a nonvolatile manner and make a supply voltage for the bistable circuit lower than a voltage during a period to read data from or write data into the bistable circuit when the period not to read or write data is shorter than the predetermined time period,
wherein the predetermined time period is equal to or longer than a period during which an amount of energy consumed when the supply voltage for the bistable circuit during the predetermined time period is lowered becomes equal to an amount of energy consumed when data is stored and restored into the nonvolatile element.

10. The memory circuit according to claim 9,
wherein the predetermined time period is equal to or longer than $(E_{store}^{SC} + E_{restore}^{SC} / ((I_{LS}^{NV} - I_{L}^{SD}) \times V_{sleep})$,
$E_{store}^{SC}$ representing an energy calculated by subtracting an energy in a case where the supply voltage for the bistable circuit is lowered during a period to store data into the nonvolatile element, from an energy for storing data into the nonvolatile element,
$E_{restore}^{SC}$ representing an energy calculated by subtracting an energy in a case where the supply voltage for the bistable circuit is lowered during a period to restore data from the nonvolatile element, from an energy for restoring data from the nonvolatile element,
$I_{LS}^{NV}$ representing a current consumed in a case where the supply voltage for the bistable circuit is lowered,
$I_{L}^{SD}$ representing a current consumed in a case where the power supply to the bistable circuit is cut off,
$V_{sleep}$ representing a supply voltage in a case where the supply voltage for the bistable circuit is lowered.

11. A memory circuit comprising:
a bistable circuit configured to write data;
a nonvolatile element configured to store data written in the bistable circuit in a nonvolatile manner and restore data stored in a nonvolatile manner into the bistable circuit by changing a resistance value with a current flowing between one end and the other end, the nonvolatile element having the one end connected to a node in the bistable circuit and the other end connected to a control line;
an FET having a source and a drain connected in series to the nonvolatile element between the node and the control line; and
a control unit configured to make a highest voltage to be applied to a gate of the FET during a period to restore data stored in the nonvolatile element in a nonvolatile manner into the bistable circuit lower than a voltage of a node being at a high level in the bistable circuit during a period to write data into and read data from the bistable circuit in a volatile manner.

12. The memory circuit according to claim 11, wherein the control unit makes a highest voltage to be applied to the gate during a period to store data written in the bistable circuit into the nonvolatile element in a nonvolatile manner lower than the voltage of the node being at the high level in the bistable circuit during the period to write data into and read data from the bistable circuit in a volatile manner.

13. The memory circuit according to claim 11, wherein the control unit makes the highest voltage to be applied to the control line during a period to store data written in the bistable circuit into the nonvolatile element in a nonvolatile manner lower than the voltage of the node being at the high level in the bistable circuit during the period to write data into and read data from the bistable circuit in a volatile manner.

14. The memory circuit according to any one of claim 2, wherein the predetermined time period is equal to or longer than $(E_{store}^{SC}+E_{restore}^{SC}/((I_{LS}^{NV}-I_{L}^{SD})\times V_{sleep})$, $E_{store}^{SC}$ representing an energy calculated by subtracting an energy in a case where the supply voltage for the bistable circuit is lowered during a period to store data into the nonvolatile element, from an energy for storing data into the nonvolatile element, $E_{restore}^{SC}$ representing an energy calculated by subtracting an energy in a case where the supply voltage for the bistable circuit is lowered during a period to restore data from the nonvolatile element, from an energy for restoring data from the nonvolatile element, $I_{LS}^{NV}$ representing a current consumed in a case where the supply voltage for the bistable circuit is lowered, $I_{L}^{SD}$ representing a current consumed in a case where the power supply to the bistable circuit is cut off, $V_{sleep}$ representing a supply voltage in a case where the supply voltage for the bistable circuit is lowered.

15. The memory circuit according to claim 9, wherein the bistable circuit includes a first node and a second node, the first node and the second node being complementary to each other, and the nonvolatile element includes a first nonvolatile element having one end connected to the first node and the other end connected to the control line, and a second nonvolatile element having one end connected to the second node and the other end connected to the control line.

* * * * *